(12) United States Patent
Xiao (10) Patent No.: US 6,657,431 B2
(45) Date of Patent: Dec. 2, 2003

(54) SCANNING MAGNETIC MICROSCOPE HAVING IMPROVED MAGNETIC SENSOR

(75) Inventor: Gang Xiao, Barrington, RI (US)

(73) Assignee: Brown University Research Foundation, Providence, RI (US)

(*) Notice: Subject to any disclaimer, the term of this patent is extended or adjusted under 35 U.S.C. 154(b) by 0 days.

(21) Appl. No.: 09/875,436

(22) Filed: Jun. 6, 2001

(65) Prior Publication Data

US 2002/0033695 A1 Mar. 21, 2002

Related U.S. Application Data

(60) Provisional application No. 60/209,756, filed on Jun. 6, 2000.

(51) Int. Cl.[7] .................. G01N 27/82; G01R 33/09; G01R 33/12
(52) U.S. Cl. .................. 324/244; 324/210; 324/252; 324/750
(58) Field of Search .................. 73/105; 324/210, 324/244, 249, 251, 252, 263, 750–772; 360/324, 324.1, 324.2; 250/311, 306

(56) References Cited

U.S. PATENT DOCUMENTS

| | | | | |
|---|---|---|---|---|
| 4,588,946 A | * | 5/1986 | Lin .................. | 324/767 |
| 5,038,104 A | * | 8/1991 | Wikswo, Jr. et al. .......... | 324/258 |
| 5,465,046 A | * | 11/1995 | Campbell et al. ........... | 324/244 |
| 5,491,411 A | * | 2/1996 | Wellstood et al. .......... | 324/248 |
| 5,508,517 A | * | 4/1996 | Onuki et al. ................ | 250/306 |
| 5,543,988 A | * | 8/1996 | Brady et al. ................ | 360/112 |
| 5,589,780 A | * | 12/1996 | Ueda et al. ................ | 324/751 |
| 5,650,958 A | | 7/1997 | Gallagher et al. ............. | 5/127 |
| 5,652,445 A | * | 7/1997 | Johnson ...................... | 257/295 |
| 5,793,743 A | * | 8/1998 | Duerig et al. ............... | 369/126 |

(List continued on next page.)

OTHER PUBLICATIONS

Ho et al. "Study of Magnetic Tunnel Junction Read Sensors," IEEE Transactions on Magnetics, vol. 37, No. 4, Jul. 2001, pp. 1691–1694.*
Plourde et al. "Design of a scanning Josephson junction microscope for submicron–resolution magnetic imaging," Review of Scientific Instruments, vol. 70 No. 11, Nov. 1999, pp. 4344–4347.*
Wang et al. "Large finite–size effect of giant magnetoresistance in magnetic granular thin films," Physical Review B (Condensed Matter), vol. 51, No. 9, Mar. 1995 (Abstract).*
Yamamoto et al., "Scanning Magnetoresistance Microscopy," Applied Physics Letters, 69 (21), Jun. 10, 1996, pp. 3263–3265.*
http://www.neocera.com/html–files/magma/magma.htm, Unprecedented Accuracy in Location of buried Faults, Oct. 30, 1999, Neocera.

(List continued on next page.)

*Primary Examiner*—N. Le
*Assistant Examiner*—Darrell D Kinder
(74) *Attorney, Agent, or Firm*—Harrington & Smith, LLP (57) ABSTRACT

A scanning magnetic microscope includes a specimen stage for holding a specimen to be examined; a sensor for sensing a magnetic field generated by the specimen, the sensor including one of a magnetic tunneling junction (MTJ) sensor, a spin valve sensor, or an extraordinary Hall effect sensor; translation apparatus for translating the sensor relative to a surface of said specimen; and a data processor, having an input coupled to an output of said sensor, for constructing an image of said magnetic field. In another embodiment a read/write head from a hard disk drive is shown to make a suitable magnetic sensor. The scanning magnetic microscope can be used for examining the current flow in integrated circuits and related phenomenon, such as electromigration, as well as magnetic data storage media and biomagnetic systems, to mention a few suitable applications.

23 Claims, 8 Drawing Sheets

U.S. PATENT DOCUMENTS

| | | | | |
|---|---|---|---|---|
| 5,834,938 | A | * 11/1998 | Odawara et al. | 324/248 |
| 5,856,617 | A | * 1/1999 | Gurney et al. | 73/105 |
| 5,862,022 | A | * 1/1999 | Noguchi et al. | 360/324.2 |
| 5,966,012 | A | * 10/1999 | Parkin | 324/252 |
| 6,005,753 | A | * 12/1999 | Fontana, Jr. et al. | 360/324.2 |
| 6,118,284 | A | * 9/2000 | Ghoshal et al. | 324/750 |
| 6,150,809 | A | * 11/2000 | Tiernan et al. | 324/238 |
| 6,165,287 | A | * 12/2000 | Sato et al. | 148/276 |
| 6,237,399 | B1 | * 5/2001 | Shivaram et al. | 73/105 |
| 6,266,218 | B1 | * 7/2001 | Carey et al. | 360/324.12 |
| 6,297,630 | B1 | * 10/2001 | Dietzel et al. | 324/210 |
| 6,396,261 | B1 | * 5/2002 | Martchevskii et al. | 324/235 |
| 6,448,766 | B1 | * 9/2002 | Berger et al. | 324/244 |

OTHER PUBLICATIONS

Honeywell Magnetic Sensors 8 Pin SIP Package (HMC1001), *http://www.ssec.honeywell.com/magnetic/package/package_1001.html*,2002.

Honeywell Magnetic Sensors SPEC Sheet HMC1001, *http://www.ssec.honeywell.com/magnetic/spec_1001.html*, 2002.

Honeywell Sensor Products 1–and 2–Axis Magnetic Sensors HMC1001/1002 HMC1021/1022, 900248 Rev. B, Apr., 2002.

Honeywell Magnetic Sensors SPEC Sheet HMC2003, *http://www.ssec.honeywell.com/magnetic/spec_2003.html*, 2002.

Honeywell Magnetic Sensors HMC2003 Description, *http://www.ssec.honeywell.com/magnetic/desription/desc_2003.html*,2002.

Honey Well Sensor Products Three Axis Magnetic Sensor Hybrid HMC2003,900151 Rev. C, Oct. 1997.

* cited by examiner

FIG. 1

FIG. 2A $\quad H_N = \frac{\pi^2}{\sqrt{2}} \left( \frac{h^2}{\lambda t_F} \right) M_S \text{EXP}(-2\pi\sqrt{2} t_s / \lambda)$ FIG. 2B $\quad S_H(f) = \left( \frac{1}{R} \frac{dR}{dH} \right)^{-2} \left( \frac{1}{V} \right)^2 S_V(f)$ FIG. 2C $\quad S_V(f) = 4kRT + 2eVR + \alpha \frac{V^2}{Nf}$

OPTICAL MICROSCOPE IMAGE (75×200 μm)

FIG.7A

OPTICAL MICROSCOPE IMAGE (220×1000 μm)

FIG.8A

CURRENT DENSITY MAP

FIG.7B

MAGNETIC FIELD IMAGE

FIG.7C

MAGNETIC FIELD IMAGE

FIG.8B

CURRENT DENSITY MAP

FIG.8C

SCANNING MAGNETIC MICROSCOPE HAVING IMPROVED MAGNETIC SENSOR

CLAIM OF PRIORITY FROM A PROVISIONAL PATENT APPLICATION

This patent application claims priority from provisional patent application No. 60/209,756, filed Jun. 6, 2000, the content of which is incorporated by reference herein in its entirety.

STATEMENT OF GOVERNMENT RIGHTS

This invention was made with government support under grant numbers NSF DMI-9960292 (SBIR grant), and NSF DMR-0071770. The government has certain rights in the invention.

FIELD OF THE INVENTION

This invention pertains to a high resolution and sensitive magnetic microscope using one of a plurality of different magnetic sensor types, including a magnetic tunneling junction, a spin valve, and an extraordinary Hall effect sensor. Suitable applications for the magnetic microscope include semiconductor integrated circuit (IC) and data storage research and manufacturing monitoring, as well a number of biological, chemistry, physics, and materials research applications.

BACKGROUND OF THE INVENTION

The need for a sensitive magnetic microscope with a high degree of spatial resolution is felt in many industries. For example, IC engineers and designers can use such a microscope to carry out non-invasive measurements of electrical current distributions within an IC chip, and they may survey the operation of tiny devices—pinpointing electrical defects down to the smallest unit (transistor, diode, interconnects, etc.). They may also study electro-migration of interconnects to develop even finer conducting lines. In another application, a data-storage professional can image ultrafine domain structures of future recording media with a magnetic microscope of sufficient sensitivity and resolution. These media will have an increasingly small domain size, eventually approaching the adverse superparamagnetic limit. Furthermore, the magnetic microscope is also applicable to a range of basic research areas, such as flux line structures.

Many physical objects generate magnetic fields (H) near the objects' surfaces, and the magnetic microscope can obtain images of the magnetic fields by scanning a magnetic sensor on the surface of the object of interest. Such images can be spatially microscopic and weak in field strength. Nevertheless, these images reveal important signatures of inherent electrical and magnetic processes within the objects. For example, the magnetic image of a magnetic thin film discloses its internal magnetic domain structure (spatial electron-spin configuration); The electrical currents within an integrated circuit (IC) chip generate external magnetic images, which not only contain information of current-distribution, but also the frequencies with which various components on a chip are operating; A type II superconductor also creates an image of threading magnetic flux lines, whose structure and dynamics are fundamental properties. Researchers have confirmed the d-wave symmetry in high-$T_c$ superconductors by studying the flux line images in a uniquely designed sample.

There are currently a number of techniques for imaging magnetic fields at surfaces.

Electron holography and SEMPA (scanning electron microscopy with polarization analysis) require high vacuum operation and delicate sample preparation. Both techniques offer static field images with good spatial resolution. However, these instruments are expensive and demand great technical skill to operate.

The magneto-optical microscope is a relatively simple system and is suitable for time-resolved imaging. However its field sensitivity and spatial resolution are poor.

The conventional scanning magnetic microscope has a microscopic field sensor, typically a superconducting quantum interference device (SQUID), a Hall probe, or simply a magnetic tip. This type of microscope scans the magnetic sensor relative to a sample to obtain a local field image. Though very sensitive, a SQUID probe is poor in resolution (~5 $\mu$m), and requires cryogenics (77K). A Hall probe can operate under ambient conditions, but its sensitivity is low. The magnetic microscope equipped with a magnetic tip can only measure the gradient of the magnetic field, and cannot sense a high frequency signal (e.g. MHz-GHz).

Prior to this invention the conventional magnetic imaging systems, such as the conventional scanning magnetic microscope, suffered from at least one of an inadequate sensitivity or an inadequate spatial resolution, resulting in the generation of magnetic field images that were less than optimum.

SUMMARY OF THE INVENTION

An aspect of this invention lies in the adaptation of high-performance magnetic sensors, for example, the magnetic tunneling junction (MTJ), as the sensing element for a magnetic microscope. MTJ sensors are superior to existing sensors. The microscope equipped with such a sensor offers excellent field-sensitivity and spatial resolution, and affords new abilities in the design and characterization of modern semiconductor chips and data storage media. The magnetic microscope operates over a wide signal frequency range, at room temperature and ambient pressure, offering cost-effective turnkey convenience These teachings provide in one aspect a scanning magnetic microscope with a magnetic-tunneling-junction (MTJ) sensor. This is a type of magnetoresistive sensor with both a high field-sensitivity and spatial resolution. The microscope operates under ambient conditions. Other types of magnetic sensors, such as spin valves and extraordinary Hall effect sensors, can also be used.

The scanning magnetic microscope in accordance with these teachings may be equipped with one of three types of magnetic sensors: magnetic tunneling, spin valve, or extraordinary Hall sensor. The scanning magnetic microscope measures a spatial magnetic field generated on the surface of a sample, such as an electrical circuit or a magnetic data storage media, and converts the resulting magnetic field map into an electrical current density map. The scanning magnetic microscope may be used to obtain the electrical current distribution in an integrated circuit network, or in a planar magnetic structure, without physically contacting the surface.

The scanning magnetic microscope may be used to measure the electromigration of fine electrical interconnects. As the width of the interconnects becomes finer (state-of-the-art, 0.18 micron, next generation, 0.15 micron), the electrical current density in the interconnects can displace atoms away from their equilibrium positions and eventually cause the interconnects to break. With the scanning magnetic microscope one may observe how the interconnects are broken gradually under various types of conditions (e.g. elevated temperature, aging, material composition, overlay, edge roughness, etc.). Using the scanning magnetic microscope one may observe the electrical current distribution of interconnects that are embedded within dielectrics. Other microscope types, such as the scanning electron microscope, cannot see embedded interconnects. An important, but not limiting, application of the scanning magnetic microscope is thus in inspecting integrated circuits, as well as in investigating the electromigration mechanism.

The conventional scanning SQUID (superconducting quantum interference device) microscope operates at low temperature (77K) and has poor spatial resolution to image room temperature objects. The scanning magnetic microscope in accordance with these teachings operates under ambient conditions, and may achieve a spatial resolution as small as 0.03 microns.

One preferred embodiment of a magnetic tunnel junction (MTJ) sensor has the following layer structure: Si wafer or Si wafer coated with $SiO_2$/60 Ta/300 Al/40 $Ni_{79}Fe_{21}$/x Cu(x: 0–100)/100 PtMn/(P2) Co/7Ru/(P1) Co/y $Al_2O_3$ (y: 3–20)/ 10 Co/70 $Ni_{79}Fe_{21}$/250 Al/75 Ta. The Cu layer is used to improve the growth of the PtMn layer exchange bias. An improved exchange bias enhances the magnetic stability of the sensor. The 10 Angstrom Co layer is used to improve magnetic stability, thereby reducing magnetic field noise. The magnetization of the pinned layers and the free layers are perpendicular to one another. The (P2)Co/7Ru/(P1)Co sequence is used to compensate the Neel coupling field, so that the magnetic offset field is zero in the sensor. A zero offset field increases the field dynamic range of the sensor.

A presently preferred magnetic tunneling junction (MTJ) multilayer structure has the form of Si wafer/SiO2/Pt (30 nm)/Py(x)/FeMn (13 nm)/Py (6 nm)/$Al_2O_3$ (0.5–2.5 nm)/Py (12 nm)/Al (49 nm). The seed layer Py (x) is either $Fe_{79}Ni_{21}$ (permalloy) with a thickness x between 2 to 10 nm, or Cu (1.5 nm)/Py (x) with x between 2 to 9 nm. The buffer layer Pt (30 nm) can be replaced by Ta (5 to 10 nm). With this layer sequence a magnetoresistance as large as 34% has been observed. Transmission-electron-micrographs of the cross section of the MTJ multilayer structure show high quality smooth and pin-hole free layer structures.

The extraordinary Hall sensor is a four terminal sensor, with two terminals for electrical current, and two terminals for measuring the Hall voltage, which is proportional to external magnetic field to be measured. The preferred composition of the extraordinary Hall sensor is $Fe_xPt_{100-x}$, or $Co_xPt_{100-x}$, and other associated alloys.

Magnetic images may be obtained in either a contact mode (sensor contacting surface) or in non-contact mode. The magnetic field spatial profile may be employed to obtain the height between the sensor and the surface of a sample. This height information is useful in calculating the magnitude of the current density.

A scanning magnetic microscope includes a specimen stage for holding a specimen to be examined; a sensor for sensing a magnetic field generated by the specimen, the sensor including one of a magnetic tunneling junction (MTJ) sensor, a spin valve sensor, or an extraordinary Hall effect sensor; translation apparatus for translating the sensor relative to a surface of said specimen; and a data processor, having an input coupled to an output of said sensor, for constructing an image of said magnetic field. In another embodiment a read/write head from a hard disk drive is shown to make a suitable magnetic sensor. The scanning magnetic microscope can be used for examining the current flow in integrated circuits and related phenomenon, such as electromigration, as well as magnetic data storage media and biomagnetic systems, to mention a few suitable applications.

BRIEF DESCRIPTION OF THE DRAWINGS

The foregoing and other aspects of these teachings will be described in detail in conjunction with the attached Drawings, wherein.

DETAILED DESCRIPTION OF THE PREFERRED EMBODIMENTS

A description will first be provided of preferred embodiments of magnetic field sensors, followed by a description of the presently preferred embodiments of the scanning magnetic microscope (SMM).

MTJ Magnetic Sensor

When subject to an external magnetic field, a metal suffers a change in its electrical resistivity. The relative resistance change is called magnetoresistance (MR), defined as $$\Delta R/R\ 32\ (R(H)-R(0))/R_s \tag{1}$$

where R(H), R(0), and $R_s$ are resistance values, at a field H, at zero field, and at saturation field, respectively. This property has been used to sense a magnetic field by measuring resistance change in a field. In general, a good magnetoresistive sensor is characterized by a large MR value achieved at a small saturation field. Normal metals, such as copper, have small MR values, typically, a fraction of a percent even at Tesla fields. A magnetic Permalloy ($Ni_{79}Fe_{21}$) film has a moderate MR value of 2–3% at a few Oe, making it adequate for read/write heads in data storage devices. The physical mechanism in Permalloy, called anisotropic magnetoresistance (AMR), is originated from the electron spin-orbit interaction.

Since the discovery of the giant magnetoresistance (GMR) effect in the mid-1980s, a new area of research, referred to as magnetoelectronics, has been developed. The electron spin, coupled with the electron charge, plays an increasingly important role in device functions. The state-of-the-art GMR sensors are made of certain thin-film multilayers. They display large MR at low fields and at room temperature. A commercial multilayer structure (Permalloy/Cu/Co), known as a spin-valve, has a MR value of 9% at 1 Oe (about twice of earth field). The GMR phenomenon is due to the spin-dependent scattering of conduction electrons off magnetic layers.

One disadvantage of GMR sensors is that these metallic structures are inherently highly conductive. A large electrical current is required to generate a sufficient signal. The total resistance depends on sensor dimensions. However, the length of a sensor cannot be made too small or the electrical signal becomes weak. This places a limitation on the miniaturization of GMR sensors.

Magnetic tunneling junctions first emerged in 1995 as another source of large magnetoresistance. MTJ devices have demonstrated a number of technical advantages over the existing GMR devices. The MTJ structure is a sandwich (metal/insulator/metal) with two ferromagnetic metallic layers (top and bottom electrodes) separated by a thin insulating barrier. The tunneling resistance depends on the relative orientation of the magnetization vectors (M) in the two metal layers. The magnetotunneling effect exploits the asymmetry in the density of states of the majority and minority energy bands in a ferromagnet. The larger the asymmetry, the larger the spin polarization, and the larger the magnetotunneling effect.

When the M vectors are parallel in the two magnetic electrodes, there is a maximum match between the numbers of occupied states in one electrode and available states in the other. The electron tunneling current is at maximum and the tunneling resistance (R) minimum. On the other hand, in the antiparallel configuration, the electron tunneling is between majority states in one electrode and minority states in the other. This mismatch results in a minimum current and a maximum resistance. Since the directions of magnetizations M can be altered by an external field, the tunneling resistance is sensitive to the field. According to the Julliere Model of magnetotunneling, the maximum MR ratio between parallel and antiparallel configurations is:

$$\Delta R/R = (R\uparrow\downarrow - R\uparrow\uparrow)/R\uparrow\uparrow = 2P_1P_2/(1-P_1P_2)$$

where $P_1$ and $P_2$ are the spin-polarization factors of the two electrodes. For a transition ferromagnetic metal (Co, Fe, Ni, and their alloys), P is in the range of 20–40%, leading to $\Delta R/R$ being approximately 12%–38%.

MTJs offer a number of significant advantages as magnetoelectronic devices. The advantages include the following. First, the junction resistance (R) can be varied easily over a wide range ($10^{-3}$–$10^8 \Omega$), while keeping intact the large MR ratio. The value of R depends on barrier thickness (t~0.5–2 nm) exponentially and on junction area (A) inversely. The ability to tailor R in MTJ to suit electronics surpasses that in GMR devices. Second, the MTJ can be miniaturized to nanometer size while retaining an adequate resistance, since R is primarily sensitive to barrier thickness. This property, not available in GMR spin-valves, is particularly important for high-resolution field imaging. Third, MTJ devices can operate in a very large frequency range (0–5 GHz) with good response. Hence such sensors can provide dynamic magnetic images. Third, the MTJ is a simple two-terminal resistive device, requiring only small current density to operate. The stray field generated by the sensing current is small. Fourth, the MTJ devices have larger MR ratio than commercial GMR spin valves at comparable fields. For example, (Fe—Ni)/$Al_2O_3$/Co junctions exhibit a MR ratio of 28% at a few $Oe^5$, whereas a commercial (Fe—Ni)/Cu/Co GMR sensor has a maximum MR of 9%.

A discussion is now made of the fabrication of a MTJ sensor for use in a magnetic microscope.

Figure 1:
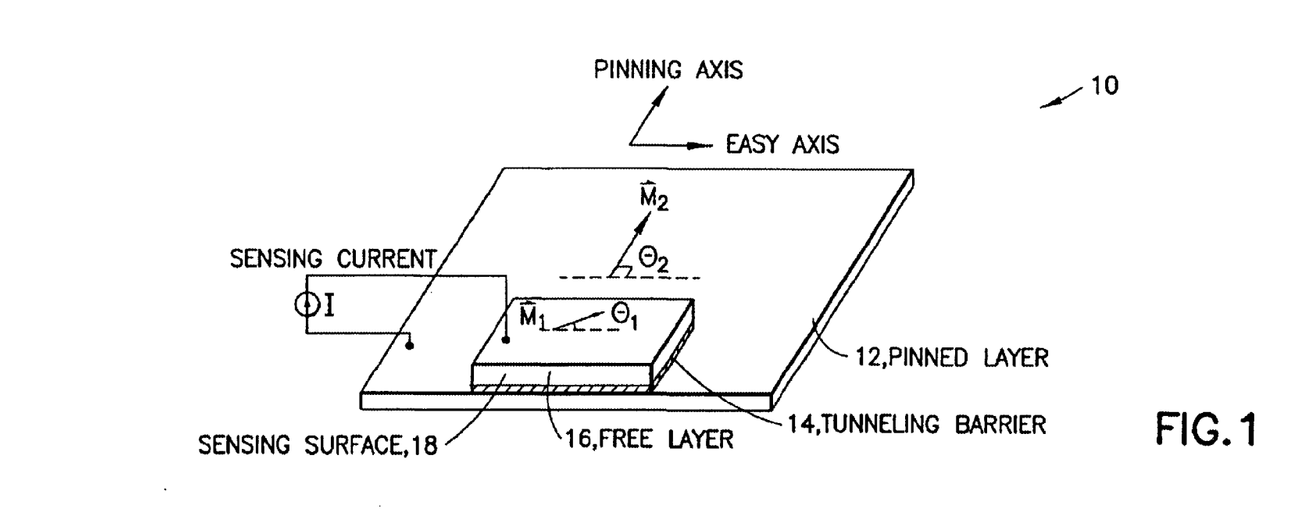
FIG. 1 is a diagram of a magnetic tunneling junction field sensor.

Two requirements for a magnetic sensor are linear field response and wide signal dynamic range. Magnetic interlayer coupling inherent in any MTJ can adversely affect both of these requirements, if not properly addressed. To understand the issues involved, consider the construction of a MTJ sensor 10 as shown in FIG. 1. The MTJ sensor 10 includes a pinned layer 12, a tunneling barrier 14, a free layer 16 and a sensing surface 18. In the absence of a signal field, the magnetic moment vector ($M_1$) of the ferromagnetic free layer 16 (the top electrode) aligns along the easy-axis ($\theta_1=0$) of the electrode. $M_1$ is allowed to rotate, i.e., changing $\theta_1$, in response to signal fields. The moment vector ($M_2$) of the bottom electrode, or the pinned layer 12, is fixed at $\theta_2=90°$ by exchange coupling with an antiferromagnetic layer, such as FeMn. According to the theory of magneto-tunneling, the resistance response of the MTJ sensor 10 to signal field (H) is given by:

$$\Delta R \propto \cos(\theta_1 - \theta_2) = \sin\theta_1 \approx \theta_1 \propto H. \qquad (2)$$

Therefore, an ideal MTJ sensor yields a linear field response near the quiescent state ($\theta_1=0$). When the free layer 16 $M_1$ is driven close to saturation by signal fields, i.e., $\theta_1 \rightarrow \pm 90°$, the linearity will fail. So, to maximize the dynamic range, it is important to keep $M_1$ along the easy-axis ($\theta_1=0$) in zero external field. However, the maintenance of this quiescent state is complicated by the existence of three internal forces, that can cause $M_1$ to deviate from the equilibrium direction.

Magnetostatic coupling results from the magnetic poles near the edges of the pinned layer 12. This field is significant for micron-size sensors, and it depends on the thicknesses, dimensions, and separation of the electrodes. Magnetostatic coupling favors antiparallel alignment between the moments of the free layer 16 and the pinned layer 12.

Neel "orange-peel" coupling originates from the ripples, or surface layer 12. The uneven layer thickness creates uncompensated dipoles, leading to local fields near the free layer 12. The strength of this coupling depends on the amplitude and the characteristic wavelength of the surface roughness, and on the interlayer separation. Because of the thin tunnel barrier, this coupling is significant for the MTJ sensor 10. The "orange-peel" coupling favors parallel alignment between the moments of the free layer 16 and the pinned layer 12.

The sensing current also generates an unwanted field. One advantage of MTJ sensors over GMR spin-valves is that the sensing current is much smaller, due to the high resistance of the MTJ sensor 10. Therefore, this field is of less concern.

The balancing of these three forces is an important task for the proper operation of the MTJ sensor 10. The key is to achieve quiescent state of the sensor 10 at the center of the linear response region, for maximum signal dynamic range.

Figure 2A:
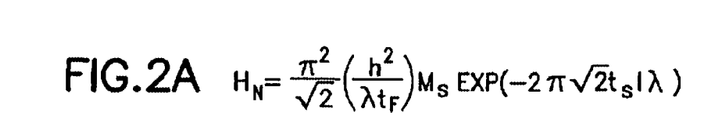
FIGS. 2A–2c show Equations that are referred to in the specification.

In Néel's model, a sinusoidal roughness profile is assumed, and the "orange-peel" coupling field is given by the expression shown in FIG. 2A, where h and $\lambda$ are the amplitude and wavelength of the roughness profile, $t_F$ and $t_s$ are the thickness of the free layer 16 and that of the barrier 14, and $M_S$ is the magnetization of the free layer 16. In samples with various $t_s$ and $t_F$, it has been found that experimental data are accounted for by the equation shown in FIG. 2A. The obtained roughness amplitude (h) and wavelength ($\lambda$) are listed the Table below.

| Method | h (Å) | λ (Å) |
| --- | --- | --- |
| transport | 7.3 ± 0.5 | 94 ± 15 |
| VSM | 7.1 ± 0.3 | 100 ± 10 |
| TEM | 10.1 ± 3.8 | 101 ± 8 |

In addition to Néel coupling, there is yet another interlayer coupling due to the stray polar magnetostatic fields ($H_M$) from the edges ($\perp$ M) of the pinned magnetic electrode. In contrast to Néel coupling, polar field coupling is dependent on junction size and shape. This property enables one to use an adequate geometrical parameter to create a stray-field for compensating the Néel coupling. Experimental results and computer simulations have shown that for a preferred sample geometry, the stray-field coupling field is given by:

$$H_M = AW^\alpha/L, \quad (3)$$

where W and L are the sample width and length in microns, A is a constant and the exponent $\alpha$ is 0.22. The value of $\alpha$ is found to be dependent on sample dimensions; in the limit where the separation between the free layer 16 and the relevant pinned layer 12 is much larger than its width, the value of $\alpha$ approaches one, whereas in the opposite limit, the value of $\alpha$ should be nearly zero. Therefore, the width dependence of the offset field becomes more prominent (larger $\alpha$) as the lateral dimension of the MTJ 10 decreases.

The total offset field is the superposition of $H_N$ and $H_M$. $H_N$ and $H_M$ differs in sign. Therefore when the magnitudes of $H_N$ and $M_M$ are equal to each other, the total offset field is zero, providing maximum dynamical range. Because of the weak dependence on the width, one can rewrite Equation 3 as:

$$HM = B/L + \epsilon(W), \quad (4)$$

where L and W are the sample length and width in microns, B is the magnetostatic coupling constant, in G-μm. $\epsilon(W)$ is generally small compared to the overall magnetostatic coupling (no more than 10% over a large range of widths) and represents the width dependence of the magnetostatic coupling. The Equation shown in FIG. 2A, and Equation 4, form the basis of the design rules to zero the internal coupling fields.

For magnetic microscopes and for other magnetic field sensing applications, the following MTJ layer structures may be employed to obtain low magnetic noise and compensated internal magnetic coupling.

The layer sequence (thickness in Angstroms) is: Si wafer or Si wafer coated with $SiO_2$/60 Ta/300 Al/40 $Ni_{79}Fe_{21}$/x Cu (x: 0–100)/100 PtMn/(P2) Co/7 Ru/(P1) Co/y $Al_2O_3$ (y: 3–20)/10 Co/70 $Ni_{79}Fe_{21}$/250 Al/75 Ta. For this structure, the PtMn is the antiferromagnetic (AFM) 'pinning' layer 12, the Co/Ru/Co tri-layer serves as the pinned electrode and the 10 Co/70 $Ni_{79}Fe_{21}$ layer functions as the 'free' electrode 16. The layer of Ru between the two Co layers (P1 and P2) has the effect of antiferromagnetically biasing these two layers through interlayer exchange. Magnetic tunneling occurs between the two Co layers, which are adjacent to the $Al_2O_3$ barrier. The pinned tri-layer Co/Ru/Co, because of its AFM ordering, substantially reduces the polar magnetostatic field. By properly selecting the thicknesses of P1 and P2, one can balance the polar field and the Néel coupling. The free bi-layer (10 Co/70 $Ni_{79}Fe_{21}$) is dominated by the Permalloy and, therefore, is 'soft' magnetically. However, magnetic tunneling occurs between two adjacent Co layers that have high magnetic ordering temperature and magnetic thermal stability. This embodiment has the benefit of low magnetic noise due to reduced magnetic fluctuations. The PtMn layer can be replaced with, by example, FeMn or IrMn antiferromagnetic films.

The MTJ sensor 10 may be grown via sputtering on a Si wafer and patterned using optical lithography. The resolution of the magnetic microscope is limited primarily by the size of the oval shape of the free magnetic electrode 16 (i.e. the 10 Co/70 $Ni_{79}Fe_{21}$ layer). For applications where spatial resolution is not critical, the more economic optical lithography process can be used. Optical lithography provides good resolution down to about 0.5 μm. This type of magnetic sensor can be used to image the electrical current distribution of printed circuit boards or large interconnects on IC chips. On the other hand, imaging the smallest device feature in an IC may require a magnetic sensor with a physical dimension at about 0.1 μm. Electron-beam lithography is preferred for use in this case, as smaller spatial features can be defined.

The Si wafer containing processed MTJ sensor(s) is diced, polished, and mounted onto a flexible cantilever. The magnetic sensor 10 is interconnected to electrical pads. The end of the cantilever is affixed to a scanning holder. A spring-loaded connector may be used to make both mechanical and electrical connections to the cantilever contact points.

A presently preferred magnetic tunneling junction (MTJ) multilayer structure has the form of Si wafer/SiO2/Pt (30 nm)/Py(x)/FeMn (13 nm)/Py (6 nm)/$Al_2O_3$ (0.5–2.5 nm)/Py (12 nm)/Al (49 nm). The seed layer Py (x) is either $Fe_{79}Ni_{21}$ (permalloy) with a thickness x between 2 to 10 nm, or Cu (1.5nm)/Py (x) with x between 2 to 9 nm. The buffer layer Pt (30 nm) can be replaced by Ta (5 to 10 nm). With this layer sequence a magnetoresistance as large as 34% has been observed. Transmission-electron-micrographs of the cross section of the MTJ multilayer structure show high quality smooth and pin-hole free layer structures.

Using samples prepared by the processes described above, an experiment was performed to measure magnetic field sensing noise vs. frequency to determine the ultimate field detection level. The sensitivity of a MR field sensor depends not only on the maximum MR ratio, but also on the inherent electronic and magnetic noise. In memory cells with hysteretic field response, a parameter of interest is the voltage noise (power spectral density $S_V(f)$) at the bi-stable "0" and "1" resistive states, where field sensitivity is close to zero. Analysis of the recorded data revealed the dominance of 1/f noise below ~500 Hz, Johnson-Nyquist "white" noise at above 500 Hz, and shot noise increasing with junction bias.

Figure 2B:
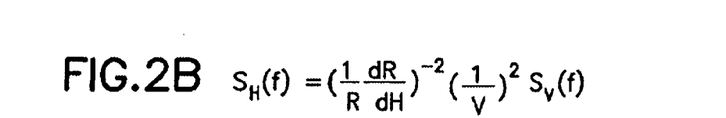
Figure 2C:
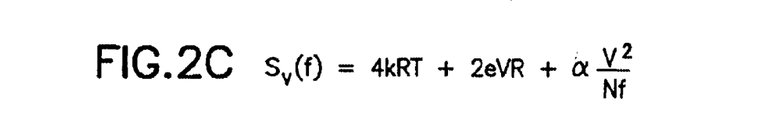

In the MTJ field sensors with linear field response, the field noise power $S_H(f)$ to be measured is dependent on the voltage noise power $S_V(f)$, as shown in the Equations of FIGS. 2B and 2C. The three terms in $S_V(f)$ are Johnson, shot, and 1/f noises, respectively. In general, a large slope of MR, 1/R, dR/dH, tends to reduces the field noise. The large saturated MR ratio, ΔR/R, in the MTJ is a beneficial factor. However, it is desirable to reduce the saturation field required to rotate the free layer 16 magnetization from equilibrium ($\theta_1$=0) to saturation ($\theta_2$=90°). For this it is desirable to use a Permalloy thin film with a certain shape as the free layer to minimize the saturation field, while maintaining integrity of the magnetic domain. At high frequency (e.g. above 500 Hz), the field noise is dominated by the Johnson and shot noise. The magnitude of these two noises is the same when eV=2kT (i.e. at room temperature, V=50 mV). However, since a typical bias voltage is less than 5 mV, shot noise can be ignored. Assuming a tunneling resistance of R=500 Ohm, the ultimate field noise is about 2 pT/sqrt (Hz) (square root Hz) due to Johnson "white" noise. This compares very favorably with conventional Hall sensor (10 nT/sqrt(Hz)) and the fluxgate (10 pT/sqrt(Hz)), which is a bulky sensor.

More difficult to deal with is the 1/f noise, which originates from many sources, such as disorders (potential and magnetic trappings) and thermal fluctuation of magnetization in the electrodes. One avenue to approach this problem is via an understanding of how thermal annealing affects the 1/f noise. Research has shown moderate thermal annealing increases the MR ratio of MTJs. This enhancement is possibly due to the reduction of disorders near the interface, which may also reduce the 1/f noise. High purity sputtering targets may also be used to reduce impurity levels. It is also possible to fabricate a dual-layer structure for the free layer 16, e.g., on the tunnel baffler 14 first deposit a thin Co film (1 mm) and then a thicker permalloy film (10 nm). The Co ferromagnet ($T_c$=1446 K) has a much larger spin-wave stiffness constant than Permalloy ($T_c$=850 K). Therefore, the thermal fluctuation of magnetization ($\Delta M$) is much weaker in Co than in Permalloy. Since tunneling occurs near the interface, the associated 1/f noise due to ($\Delta M$) is reduced. Co also has a larger spin polarization, a positive for the MR ratio. Furthermore, since the free layer 16 magnetization is dominated by the Permalloy component, the free layer 16 still retains its magnetic softness in terms of anisotropy. The sensitivity of the sensor 10 is not affected adversely by the ultra-thin Co layer.

Figure 3:
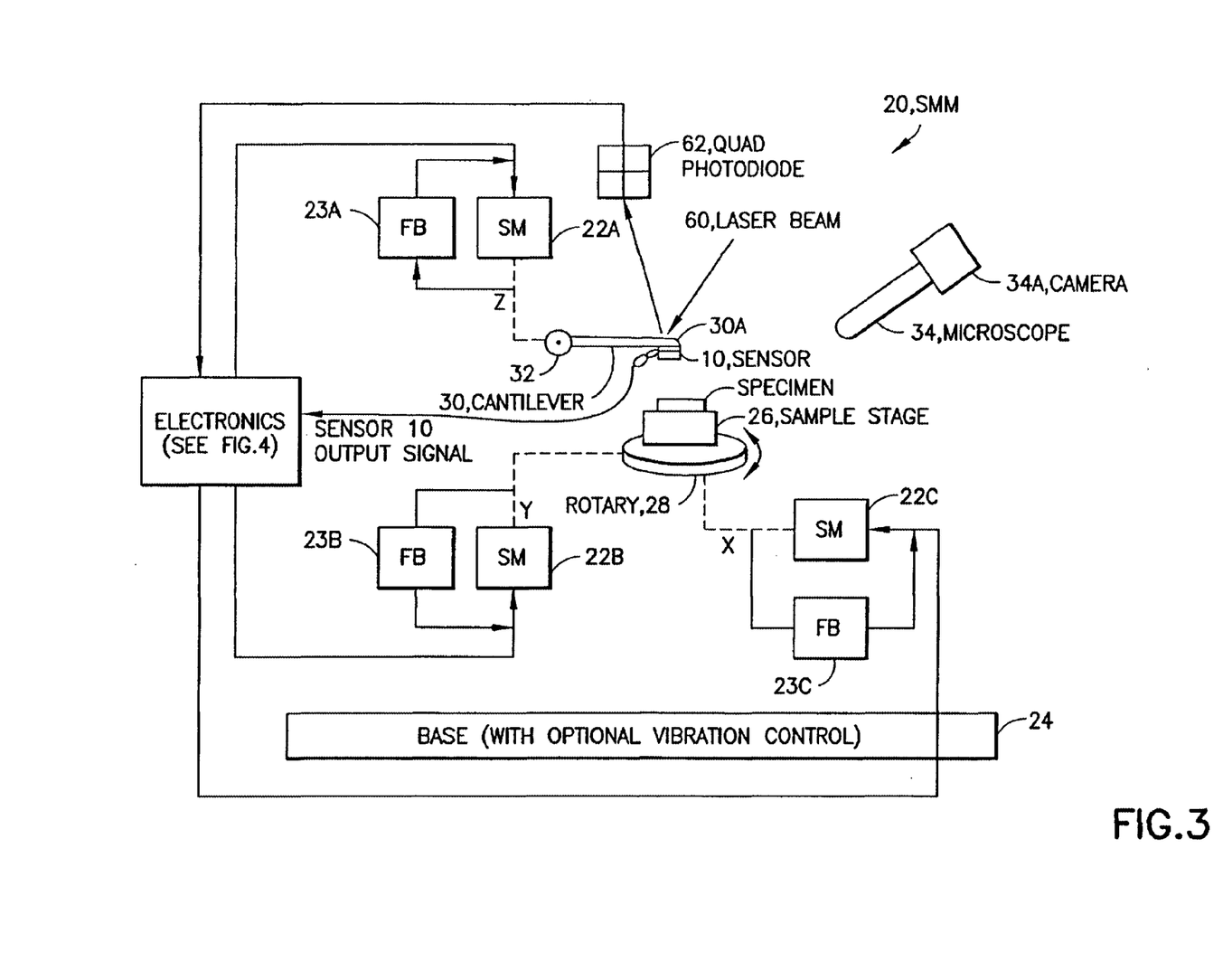
FIG. 3 shows a simplified block diagram of a Scanning Magnetic Microscope (SMM) that is constructed in accordance with these teachings.

FIG. 3 shows a simplified block diagram of a Scanning Magnetic Microscope (SMM) 20 constructed in accordance with these teachings. The SMM 20 includes three automated axis drives using DC servo motors 22A, 22B, 22C with optical feedback loops 23A, 23B, 23C that provide 0.1 $\mu$m minimum incremental motion and positioning error of <1 $\mu$m/cm of travel. The stages are heavily built with a massive base 24 to reduce vibration. Specimens are mounted on an aluminum sample block 26 which is affixed to a manual rotary stage 28. This in turn is mounted on the x-axis and y-axis stages. The specimen is held on the sample block 26 by either vacuum channels or adhesives. The sensor 10 is mounted to an aluminum finger 30 or cantilever, which overhangs the active area (e.g., 2×2 inch$^2$) of the specimen stage. The aluminum finger 30 is attached to a miniature, 1-cm travel, micrometer stage 32 that is mounted to the third servo driven z-stage. In operation, this 'z-axis' motion permits the sensor 10 to be positioned above the specimen surface at a fixed distance during automated scanning. A wide-angle zoom optical microscope 34 (e.g., 8×to 45×) may be used to inspect the position of the sensor 10 relative to the specimen surface.

Figure 4:
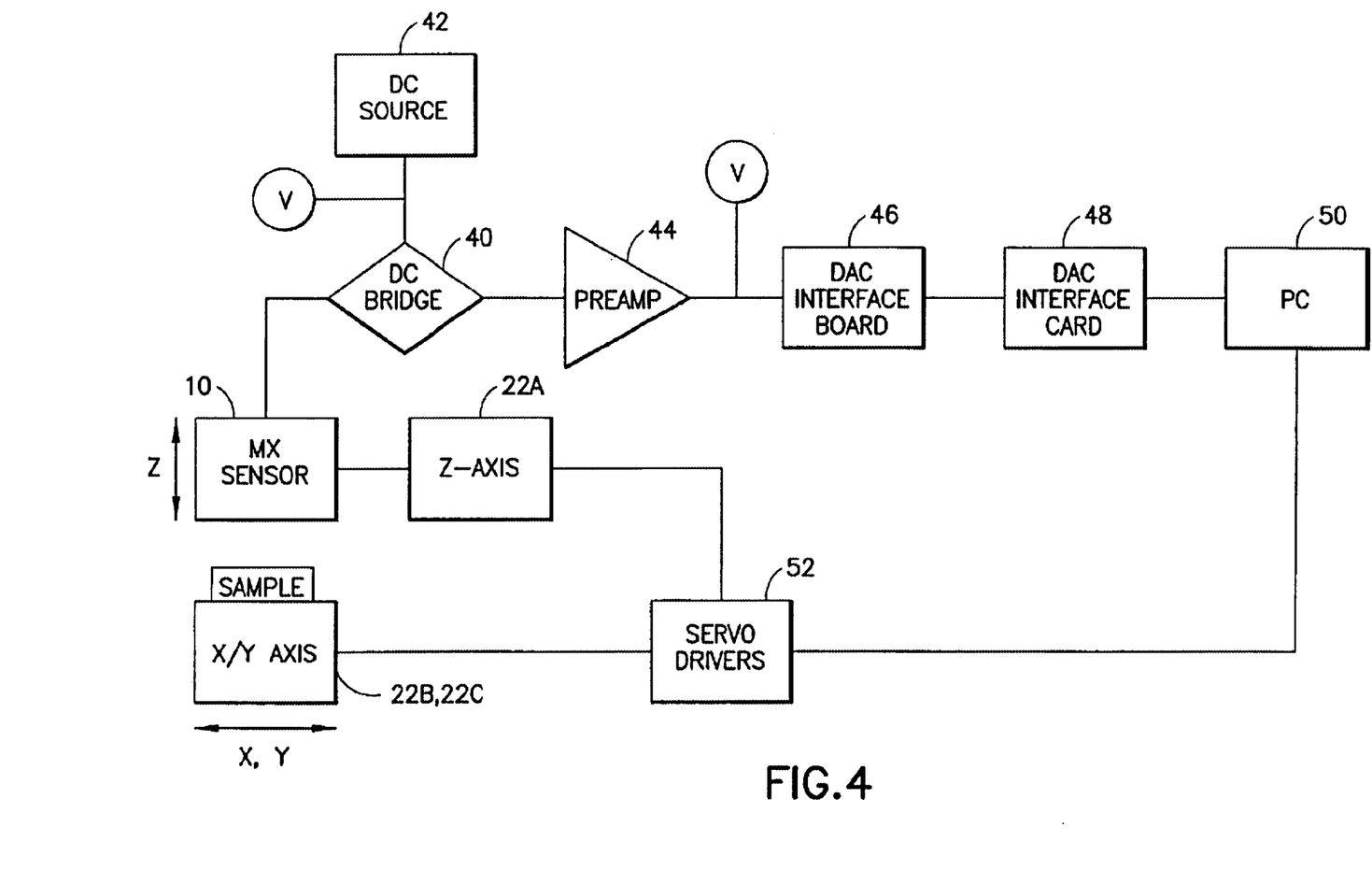
FIG. 4 is a block diagram of electronic circuitry of the SMM of FIG. 3.
Figure 5:
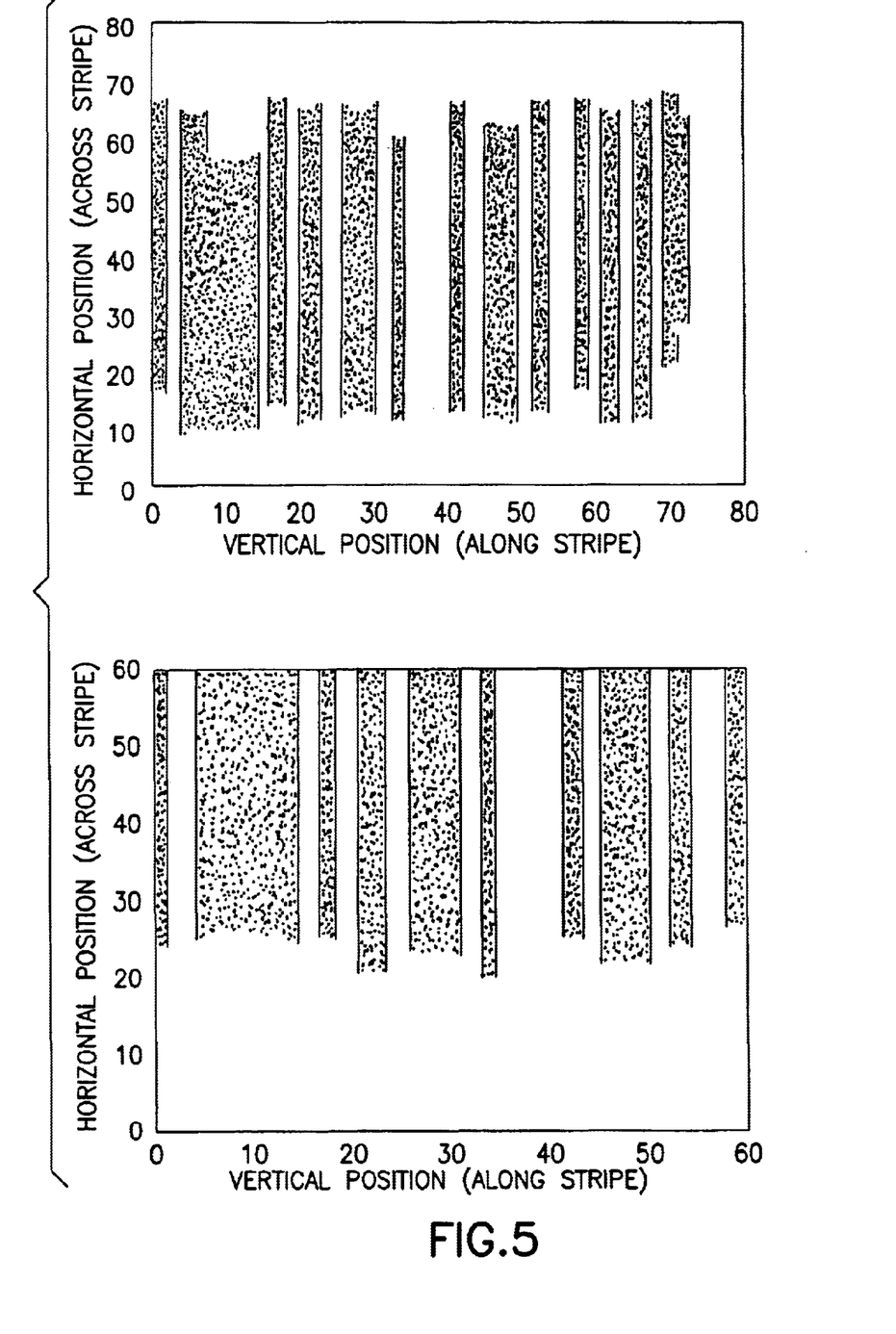
FIG. 5 is an example of magnetic images obtained from the magnetic stripe of an identification card using the SMM of FIGS. 3 and 4.
Figure 7A:
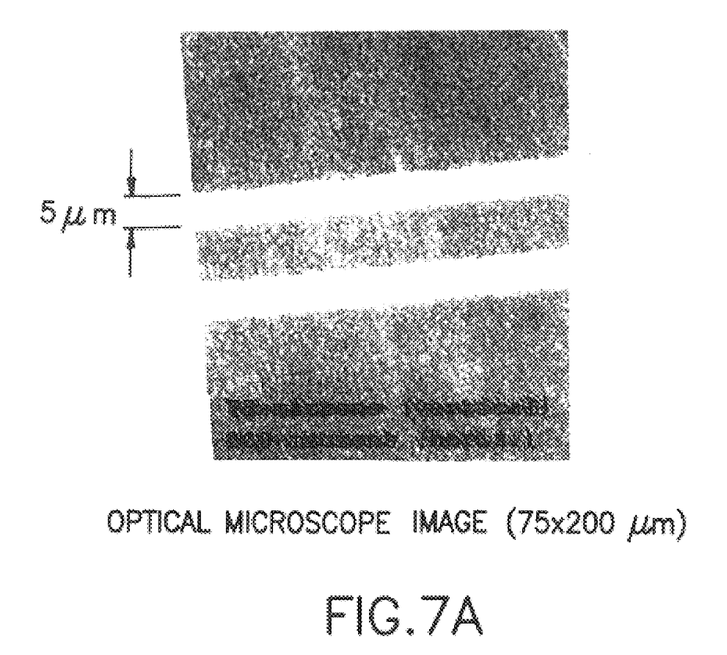
FIG. 7A is optical microscope image of features from an integrated circuit.
Figure 7B:
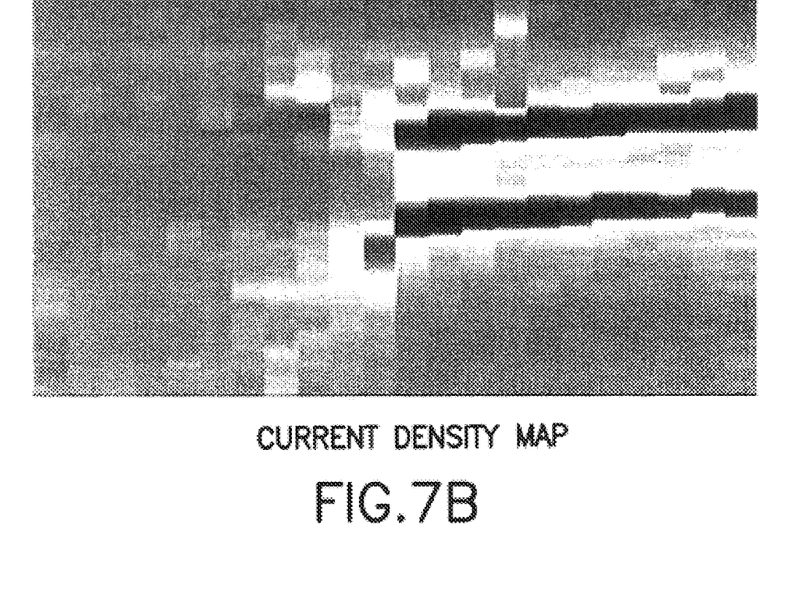
FIG. 7B is the corresponding current density map obtained using the SMM.
Figure 7C:
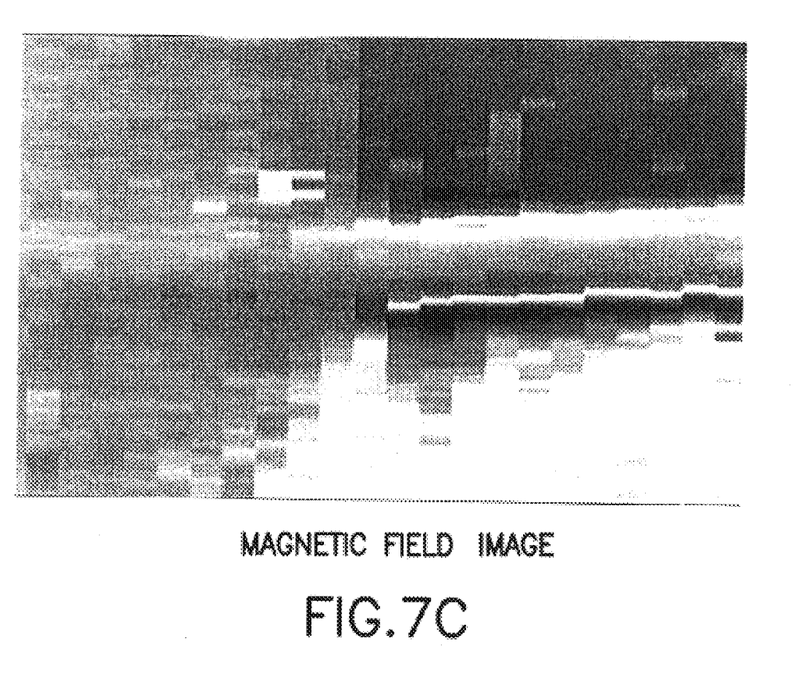
FIG. 7C is the corresponding magnetic field image.
Figure 8A:
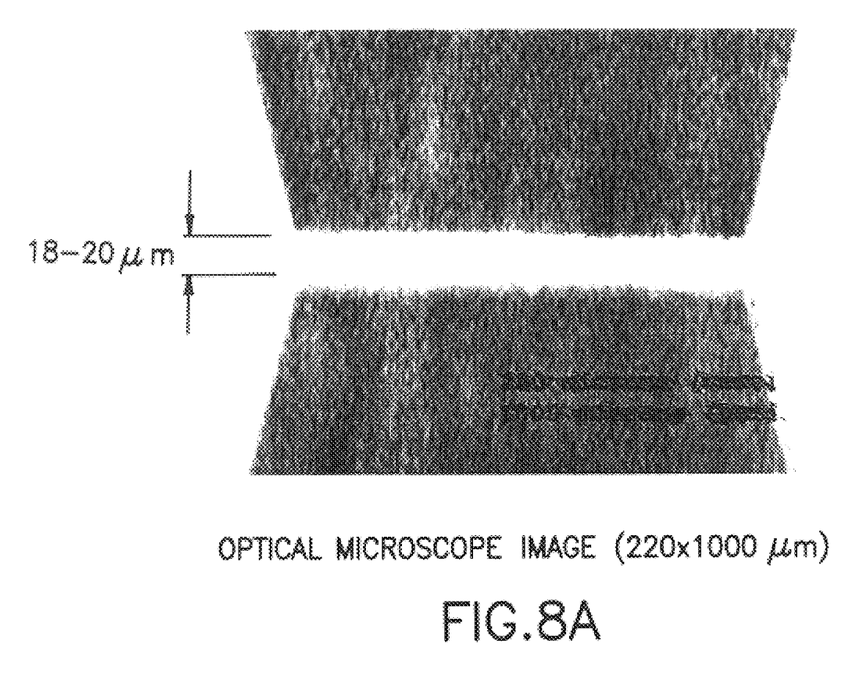
FIG. 8A is optical microscope image of features from an integrated circuit.
Figure 8B:
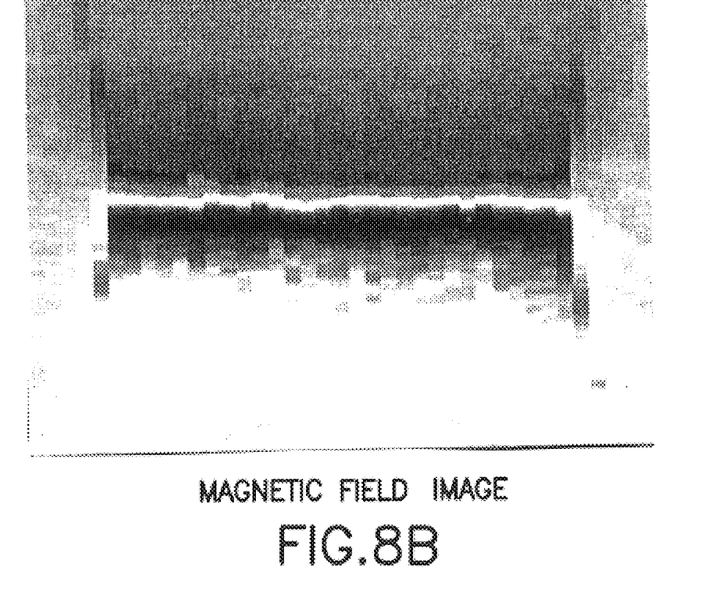
FIG. 8B is the corresponding magnetic field image.
Figure 8C:
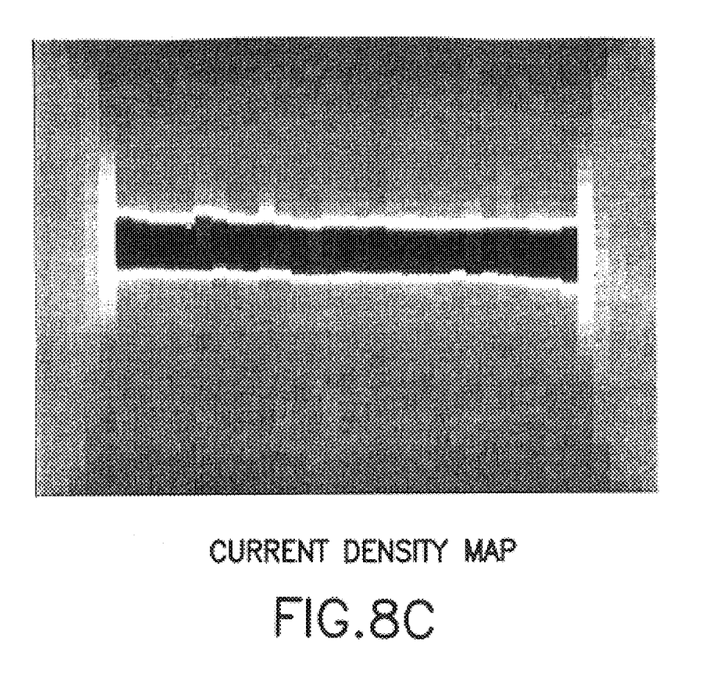
FIG. 8C is the corresponding current density map.

FIG. 4 shows a block diagram of the electronics of the SMM 20. The output of the sensor 10 is connected to a Wheatstone bridge circuit 40 having an associated DC source 42. The bridge 40 preferably has built-in protection for the sensor 10 against current surge and electrostatic breakdown. The output of the bridge 40 is fed into a low-noise differential preamplifier 44 and then into a DAC connector block 46 (e.g., National Instruments BNC-2090). The amplified signal is collected at 100 kHz using a 16-bit data acquisition board 48 (e.g., National Instruments PCI-MIO-16XE-10). The system is computer controlled using, by example, a PC 50 running a National Instruments' LabVIEW™ platform. The PC 50 controls the servo drivers 52 that provide motion in the X,Y and X axes for translating the sensor 10 relative to the surface of the specimen. The system can be configured for point-to-point scanning or to scan on-the-fly. Using the illustrated electronics a sensitivity of 60 mV/G can be achieved. The system is capable of scanning point-to-point at 10–30 Hz, depending on the size of the scanned area, while acquiring, for example, one thousand measurements at each point to reduce noise. The software system provides a two-dimensional field map of the scanned area as the system acquires data in real time. FIG. 5 is an example of magnetic images obtained from the magnetic stripe of an identification card, while FIGS. 7 and 8 are examples of images obtained from an integrated circuit. More particularly, FIG. 7A is an optical microscope 34 image of features from an integrated circuit, FIG. 7B is the corresponding current density map obtained using the SMM 20, and FIG. 7C is the corresponding magnetic field image, while FIG. 8A is the optical microscope 34 image of features from an integrated circuit, FIG. 8B is the corresponding magnetic field image, and FIG. 8C is the corresponding current density map.

The electronics for the sensor 10 are designed to operate over a wide bandwidth, from DC to at least a multiple megahertz range, and possibly into the GHz range.

High-resolution microscopy demands high accuracy and precision. Therefore, vibration isolation of the SMM 20 is preferred, particularly in a noisy environment. A commercial vibration isolation system can be used for this purpose. A cost effective strategy is to construct a tubular frame and to use a commercial component such as BenchTop™ by Newport. This construction technology attenuates the mechanical motion with a set of damped pneumatic isolators. The hybrid-chamber design generates a high damping force for faster and more efficient damping of vibrations. The Bench-Top™ unit is the most compact vibration isolation system that is presently available (16×20 in$^2$ and 30×36 in$^2$, height 2 inches) and, as such, is well suited for the SMM 20. An acoustic and/or electromagnetic shielding enclosure can be used with the SMM 20 for making very sensitive measurements.

To inspect IC chips with a state-of-the-art feature size, the SMM 20 employs a high precision mechanical scanner for motion control. In the preferred embodiment of FIG. 3, high-resolution and long travel XY stages are used, with a 25 nm resolution and a ±10 nm repeatability. In addition to XY motions, rotational motions, provided by rotational stage 28, may be desired about the same XY axes. The cantilever 30, which holds the MTJ sensor 10, is attached to the Z-axis stage. The sensor-specimen distance can be predetermined to be any reasonable value. The vertical position of the sensor 10 may be monitored by using an optical technique, such as a laser beam reflection technique, wherein a diode laser beam 60 (FIG. 3) is focused on a reflective (e.g., gold-coated) back surface 30A of the cantilever 30. The reflected beam position is then measured by a quadrant photodiode 62 having an output connected to the PC 50. When in contact with the specimen, the cantilever 30 bends slightly and induces a variation of the reflected beam position. The output of the photodiode signal is used for height (z-axis) control. The Z-axis stage is programmed to control the height automatically while the specimen is being scanned. The contact mode may be used for maximum spatial resolution, while the fixed-height mode is suitable for fast scanning.

The optical microscope 34 can be equipped with a CCD camera 34A for visual inspection of the specimen. In this case it may be desirable to superimpose the magnetic image on the optical image of the specimen, such as an IC device or a magnetic medium. The comparison of the two images enables the user to pinpoint the location(s) of abnormality and defects. A "joystick" capability may be included to control the scanning position and area. Various specimen holders will be designed to accommodate different specimen. Magnetic media and flat objects will be fixed using vacuum channels on sample stages. For IC's, universal or special sockets (zero-force insertion type, if possible) will be used for convenient mounting and electrical connection during imaging.

While described above in the context of the Wheatstone bridge circuit 40 for measuring the sensor 10 MR response, electronic bridge auto-nulling and op-amp replacements for the bridge resistances may also be used. In this manner different resistances of the various special purpose MTJ sensors can be accommodated electronically. One challenge of using an MTJ sensor is that the device is electronically fragile and can be easily damaged by a current surge and/or by an electrostatic discharge. Thus, protection circuitry is desirable.

To define a scanning area, the operator selects an area of interest on the visual optical image on a monitor screen using a pointing device (e.g., a mouse) cursor. The computer 50 then controls the Z-axis position of the sensor 10 as the scan proceeds within the area. The laser beam reflection system 60, 62 measures each local height of the specimen. Based on this information, the software establishes the local height profile, and controls the sensor at either a fixed height or in contact with the specimen while scanning.

One of the major applications of the SMM 20 is in the semiconductor industry for non-invasive testing of IC chips, printed circuit boards, and hybrid microcircuits. In this context the SMM 20 images the magnetic fields near the surface of a specimen. The application software executed by the PC 50 (or by another processor) generates a two-dimensional image of the current distribution, as calculated from the magnetic field image. The mathematics of this conversion is known in the art as the "magnetic inverse problem". In general, the magnetic inverse problem does not have a unique solution of current distribution. However, it has been demonstrated that for current distributions restricted to two dimensions, the inverse problem can be solved uniquely. The mathematical techniques involved are Fourier transforms combined with spatial filtering. In an IC chip, the electronic network can be approximated as a two dimensional current network, assuming that the thickness of the network is much smaller than the distance between the current source and the sensor 10.

Figure 6:
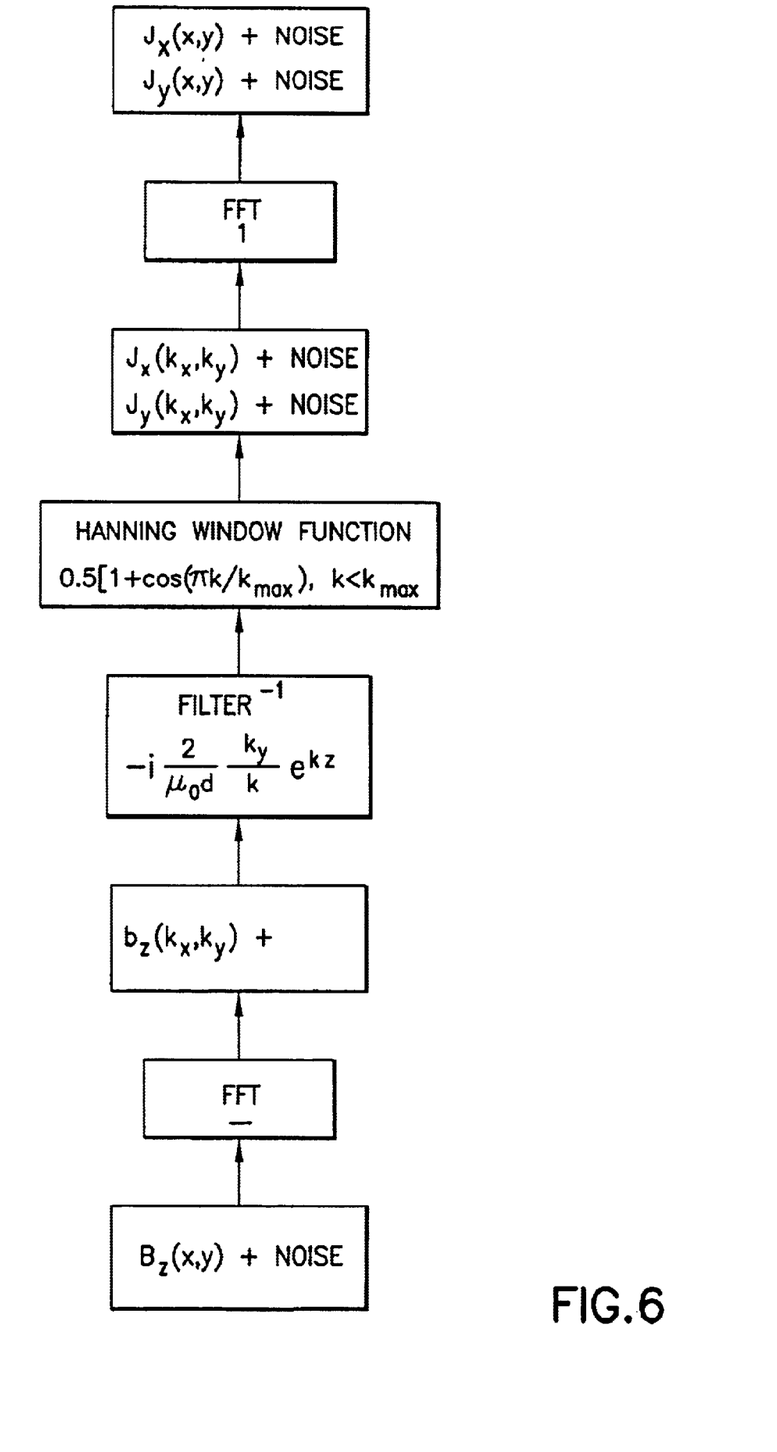
FIG. 6 is a logic flow diagram of an algorithm used when generating the magnetic images of FIG. 5.

One suitable algorithm is one developed by Roth et al., which uses fast Fourier transformation (FFT) and Green's function method. In this algorithm, the current density distribution $J_x(x,y)$ and $J_y(x,y)$ can be obtained by measuring any one component of the magnetic field (e.g. $B_z(x,y)$). FIG. 6 outlines the computer calculation model. In the instant embodiment the SMM 20 first scans the surface of an IC chip, and obtains the z-component magnetic field image $B_z(x,y)$ which contains some noise. The software performs a fast Fourier transform to obtain $b_z(k_x,k_y)$, which is then divided by a filter function, namely, the Fourier transform of the Green's function in the equation of Biot and Savart in electromagnetism. In the presence of noise, the inverse calculation may be unstable because the high-spatial-frequency noise is inevitably amplified. A common technique to surmount this difficulty is to apply a Hanning window function, which eliminates the high-spatial-frequency components. After obtaining the Fourier components $j_x(k_x,k_x)$ and $j_y(k_x,k_y)$, inverse fast Fourier transforms are employed to yield the real-space images of the current distributions $J_x(x,y)$ and $J_y(x,y)$.

The current distribution image is dependent on the noise level in $B_z(x,y)$, the sensor-specimen distance, the size of the MTJ free electrode 16, and the spatial feature size of the current network. Certain factors can be automatically measured by the SMM 20 electronics (noise, distance, etc.) for inclusion in the calculation.

For magnetic storage media applications, the SMN 20 may be employed to assist engineers to evaluate magnetic uniformity of a medium, and/or the sizes and positions of magnetic particles on a medium surface. One of the principal limits affecting the manufacturing yield of magnetic storage media is the presence of unwanted magnetic particles, which are more detrimental to the performance of the media than the occasional non-magnetic particles. The SMM 20 may be employed for such production line quality control evaluations. Unlike the magnetic force microscope, that is sensitive only to the field gradient, MTJ SNM 20 may be used to measure the absolute field strength from the magnetic particles. The high sensitivity of the MTJ sensor 10 allows rapid scanning and thus facilitates production line inspection. For example, the SMM 20 may be used to track and map the amplitude and the direction of the dipolar moments, the size distribution and the field strength of magnetic particles on the media, as well as to locate non-magnetic inclusions. This type of information is a significant aid in production quality control.

There are in general two types of applications for the MTJ device in accordance with these teachings, one for magnetic memory, called non-volatile magnetic random access memory (MRAM), and the other for the magnetic sensor 10, as used in the SMM 20. For MRAM applications, one needs to compensate the interlayer magnetic coupling, as discussed above. For the magnetic sensor 10 application, it is preferred to compensate for the interlayer magnetic coupling, but it is less critical. The surface roughness of the electrode Py (6 nm) immediately below the insulating layer $Al_2O_3$ (0.5–2.5 nm) causes a Neel coupling field. To compensate for this field, one may adjust the thickness of Py layer, and the entire polar field can therefore cancel the Neel field. Another method is to use a tri-layer structure as described above.

Other applications may also benefit from the use of these teachings, including investigations of type II superconductors, micromagnetics in small magnetic systems, and biomagnetism in biological materials. The ability to make non-contact magnetic field measurements can be especially beneficial in some of these applications.

While described above in the context of various types of magnetic sensors, it has also been discovered that the magnetic sensor 10 of the SMM 20 may be an off-the-shelf read/write head used for a computer hard drive. For example, the resistance of the giant magnetoresistance read/write head is about 30 Ohm, and the sensor area is believed to be about 10 nm by about 0.7 micron. The scanning direction is made to be along the narrower side (i.e., the 10 nm side) of the head. Along this direction the spatial resolution can thus approach some tens of nanometers. As a comparison, the wire-width in state-of-the-art IC chips is about 180 nm. The magnetic sensor 10 in this embodiment is thus a giant magnetoresistance (GMR) read/write head having a sensing area defined by a length (L) times a width (W), where W<L, where the read/write head is translated, relative to a surface of the specimen, such that the width is parallel to the translation direction. This embodiment thus makes use of the off-the-shelf read/write head as an economic magnetic sensor for use in the SMM 20. However, for improved sensitivity and spatial resolution, it is preferred to employ small MTJ sensors, as described above, rather than the GMR read/write head.

While described in the context of the scanning magnetic microscope 20 that can be used to image integrated circuit features and magnetic media, the use of the scanning magnetic microscope is not limited to only these important applications. For example, the scanning magnetic microscope 10 may also be used to detect the presence of magnetic ink, such as ink used to print currency.

Thus, while described in the context of presently preferred embodiments and applications, it should be appreciated that these teachings should be given a scope commensurate with scope of the appended claims.

What is claimed is:

1. A scanning magnetic microscope, comprising:
   a specimen stage for holding a specimen to be examined;
   a magnetic tunneling junction (MTJ) sensor for sensing a magnetic field generated by said specimen;
   translation means for translating said MTJ sensor relative to a surface of said specimen; and
   a data processor, having an input coupled to an output of said MTJ sensor, for constructing an image of said magnetic field that is used to construct an electrical current density map that is descriptive of electrical currents flowing within said specimen.

2. A scanning magnetic microscope as in claim 1, wherein said is comprised of an integrated circuit.

3. A scanning magnetic microscope comprising:
   a specimen stage for holding a specimen to be examined;
   a magnetic tunneling junction (MTJ) sensor for sensing a magnetic field generated by said specimen;
   translation means for translating said MTJ sensor relative to a surface of said specimen, wherein said translation means is comprised of an optical sensor for detecting a height of said MTJ sensor relative to said surface; and
   a data processor, having an input coupled to an output of said MTJ sensor, for constructing an image of said magnetic field.

4. A scanning magnetic microscope comprising:
   a specimen stage for holding a specimen to be examined;
   a magnetic tunneling junction (MTJ) sensor for sensing a magnetic field generated by said specimen, wherein said MTJ sensor is comprised of a multilayer structure having the form: Si wafer/SiO2/Pt (30 nm)/Py(x)/FeMn(13 nm)/Py (6 nm)/Al$_2$O$_3$ (0.5–2.5 nm)/Py (12 nm)/Al (49 nm), where a seed layer Py (x) is selected from one of either Fe$_{79}$Ni$_{21}$ with a thickness x between 2 to 10 nm, or Cu (1.5 nm)/Py (x) with x between 2 to 9 nm;
   translation means for translating said MTJ sensor relative to a surface of said specimen; and
   a data processor, having an input coupled to an output of said MTJ sensor, for constructing an image of said magnetic field.

5. A scanning magnetic microscope comprising:
   a specimen stage for holding a specimen to be examined;
   a magnetic tunneling junction (MTJ) sensor for sensing a magnetic field generated by said specimen, wherein said MTJ sensor is comprised of a multilayer structure having the form: Si wafer/SiO2/Ta (5 to 10 nm)/Py(x)/FeMn(13 nm)/Py (6 nm)/Al$_2$O$_3$ (0.5–2.5 nm)/Py (12 nm)/Al (49 nm), where a seed layer Py (x) is selected from one of either Fe$_{79}$Ni$_{21}$ with a thickness x between 2 to 10 nm, or Cu (1.5 nm)/Py (x) with x between 2 to 9 nm;
   translation means for translating said MTJ sensor relative to a surface of said specimen; and
   a data processor, having an input coupled to an output of said MTJ sensor, for constructing an image of said magnetic field.

6. A scanning magnetic microscope, comprising:
   a specimen stage for holding a specimen to be examined;
   a sensor for sensing a magnetic field generated by passing an AC electrical current through said specimen, said sensor comprising a giant magnetoresistance (GMR) read/write head having a sensing area defined by a length (L) times a width for (W), where W<L;
   translation means for translating said read/write head relative to a surface of said specimen, said read/write head being translated such that the width is parallel to the translation direction; and
   a data processor, having an input and coupled to an output of said sensor, for constructing an image of said magnetic field, said magnetic field image being capable of having sub-micron spatial resolution.

7. A scanning magnetic microscope, comprising:
   a specimen stage for holding a specimen to be examined;
   a sensor for sensing a magnetic field generated by said specimen, said sensor comprising a magnetic tunneling junction (MTJ) sensor;
   translation means for translating said sensor relative to a surface of said specimen; and
   a data processor, having an input coupled to an output of said sensor, for constructing an image of said magnetic field and, using said image of said magnetic field, for constructing a current density map of electrical currents flowing through said sample, said current density map having sub-micron spatial resolution.

8. A method for obtaining a magnetic field map for a specimen of interest, comprising:
   mounting the specimen to a specimen stage;
   translating a magnetic tunneling junction (MTJ) sensor relative to a surface of said specimen for sensing a magnetic field generated by said specimen; and
   operating a data processor for constructing an image of said magnetic field, said magnetic field image having sub-micron spatial resolution and is used to construct an electrical current density map that is descriptive of electrical currents flowing within said specimen.

9. A method as in claim 8, wherein specimen is comprised of an integrated circuit.

10. A method for obtaining a magnetic field map for a specimen of interest, comprising:
    mounting the specimen to a specimen stage;
    translating a magnetic tunneling junction (MTJ) sensor relative to a surface of said specimen for sensing a magnetic field generated by said specimen and operating an optical sensor for detecting a height of said MTJ sensor relative to said surface; and
    operating a data processor for constructing an image of said magnetic field, said magnetic field image having sub-micron spatial resolution.

11. A method for obtaining a magnetic field map for a specimen of interest, comprising:
    mounting the specimen to a specimen stage;
    translating a magnetic tunneling junction (MTJ) sensor in contact with a surface of said specimen for sensing a magnetic field generated by said specimen; and operating a data processor for constructing an image of said magnetic field, said magnetic field image having sub-micron spatial resolution.

12. A method for examining an electromigration effect that occurs within an electrical conductor of an integrated circuit, comprising:

mounting the integrated circuit to a specimen stage;

translating a magnetic sensor relative to a surface of said integrated circuit for sensing a magnetic field generated within said electrical conductor due to a current flow through said conductor; and operating a data processor for constructing an image of a current density within said electrical conductor, the current density being related to the electromigration effect, said current density image being capable of having sub-micron spatial resolution.

13. A method as in claim 12, wherein the step of translating translates a magnetic tunneling junction (MTJ) sensor.

14. A scanning magnetic microscope, comprising:

a specimen stage for holding a specimen to be examined;

a sensor for sensing a magnetic field generated by said specimen, said sensor comprising a spin valve sensor;

translation means for translating said sensor relative to a surface of said specimen; and a data processor, having an input coupled to an output of said sensor, for constructing an image of said magnetic field, said magnetic field image used to construct a current density map of electrical currents flowing in said specimen, said current density map being capable of having sub-micron spatial resolution.

15. A scanning magnetic microscope, comprising:

a specimen stage for holding a specimen to be examined;

a sensor for sensing a magnetic field generated by passing an AC electrical current through said specimen, said sensor comprising an extraordinary Hall effect sensor;

translation means for translating said sensor relative to a surface of said specimen; and a data processor, having an input coupled to an output of said sensor, for constructing a current density map of AC electrical currents flowing in said specimen based on the sensed magnetic fields, said current density map being capable of having sub-micron spatial resolution.

16. A scanning magnetic microscope, comprising:

means for holding a specimen to be examined, said specimen comprising a surface defining an x-y plane having a z-axis normal to the x-y plane, said specimen comprising at least one electrical conductor for conducting a flow of AC electrical current;

a sensor or for sensing a magnetic field resulting from the flow of AC electrical current through said at least one conductor and;

translation means for translating said sensor, at least in said x-y plane, relative to a surface of said specimen; and a data processor, having an input coupled to an output of said sensor, for constructing a multi-dimensional current density map of AC electrical currents flowing in said specimen, said current density map being constructed using at least a z-axis component of the sensed magnetic field.

17. A scanning magnetic microscope as in claim 16, where said data processor operates to remove noise from the z-axis component of the sensed magnetic field, and obtains a two dimensional image of the electrical current distribution in said specimen by taking an inverse Fourier transform.

18. A scanning magnetic microscope as in claim 16, where said data processor operates to obtain a current density distribution $J_x(x,y)$ and $J_y(x,y)$ by measuring the z-axis component of the magnetic field $B_z(x,y)$, which contains some noise; by performing a fast Fourier transform to obtain $b_z(k_x,k_y)$ which is divided by a filter function; by applying a Hanning window function to remove high spatial frequency components of the noise; by obtaining the Fourier components $j_x(k_x,k_y)$ and $j_y(k_x,k_y)$ and by performing an inverse fast Fourier transform to yield an image of the current density distributions $J_x(x,y)$ and $J_y(x,y)$.

19. A method for operating a scanning magnetic microscope, comprising:

providing a specimen to be examined, said specimen comprising a surface defining an x-y plane having a z-axis normal to the x-y plane, said specimen comprising at least one electrical conductor for conducting a flow of AC electrical current;

translating a sensor relative to the surface for measuring a magnetic field resulting from the flow of AC electrical current through said at least one conductor; and constructing a multi-dimensional current density map of AC electrical currents flowing in said specimen, said current density map being constructed using at least a z-axis component of the measured magnetic field.

20. A method as in claim 19, where constructing the multi-dimensional current density map includes removing noise from the z-axis component of the measured magnetic field, and obtaining a two dimensional image of the electrical current distribution in said specimen by taking an inverse Fourier transform.

21. A method as in claim 19, where constructing the multi-dimensional current density map includes obtaining a current density distribution $J_x(x,y)$ and $J_y(x,y)$ by measuring the z-axis component of the magnetic field $B_z(x,y)$, which contains some noise; performing a fast Fourier transform to obtain $b_z(k_x,k_y)$; dividing $b_z(k_x,k_y)$ by a filter function; applying a window function to remove high spatial frequency components of the noise; obtaining Fourier components $j_x(k_x,k_y)$ and $j_y(k_x,k_y)$; and performing an inverse fast Fourier transform to yield an image of the current density distributions $J_x(x,y)$ and $J_y(x,y)$.

22. A method as in claim 8, wherein the step of translating translates the MTJ sensor so as to not contact said surface.

23. A scanning magnetic microscope, comprising:

a sensor or for sensing a magnetic field generating by passing an AC current through a specimen, said sensor comprising a giant magnetoresistance (GMR) sensor having a sensing area defined by a length (L) times a width (W), where W<L; and translation means for translating said GMR sensor relative to a surface of the specimen, said GMR sensor being translated such that the width is parallel to the translation direction and having an output for coupling to an input of a data processor for constructing an image of an AC electrical current density within at least one portion of said specimen, said image being constructed using the magnetic field sensed by said GMR sensor.

* * * * *

UNITED STATES PATENT AND TRADEMARK OFFICE
CERTIFICATE OF CORRECTION

PATENT NO.   : 6,657,431 B2
DATED        : December 2, 2003
INVENTOR(S)  : Gang Xiao

It is certified that error appears in the above-identified patent and that said Letters Patent is hereby corrected as shown below:

Column 13,
Line 31, insert -- specimen -- between "said" and "is".

Column 14,
Line 48, insert -- said -- between "wherein" and "specimen".

Signed and Sealed this

Twenty-third Day of March, 2004

JON W. DUDAS
*Acting Director of the United States Patent and Trademark Office*